United States Patent [19]
Han

[11] Patent Number: 5,457,067
[45] Date of Patent: Oct. 10, 1995

[54] PROCESS FOR FORMATION OF AN ISOLATING LAYER FOR A SEMICONDUCTOR DEVICE

[75] Inventor: Young-Kyoo Han, Seoul, Rep. of Korea

[73] Assignee: Goldstar Electron Co., Ltd., Cheongju, Rep. of Korea

[21] Appl. No.: 324,399

[22] Filed: Oct. 14, 1994

[30] Foreign Application Priority Data

Oct. 14, 1993 [KR] Rep. of Korea .................. 93-21278

[51] Int. Cl.$^6$ ................................................. H01L 21/76
[52] U.S. Cl. ................................................. 437/72
[58] Field of Search ............. 437/72; 148/DIG. 85, 148/DIG. 86, DIG. 117

[56] References Cited

U.S. PATENT DOCUMENTS

| | | |
|---|---|---|
| 4,398,992 | 8/1983 | Fang et al. . |
| 5,108,946 | 4/1992 | Zdebel et al. ............. 437/72 |
| 5,248,350 | 9/1993 | Lee . |
| 5,399,520 | 3/1995 | Jang . |

FOREIGN PATENT DOCUMENTS

| | | |
|---|---|---|
| 58-35938 | 3/1983 | Japan . |
| 60-133739 | 7/1985 | Japan . |
| 63-141346 | 6/1988 | Japan . |
| 63-261728 | 10/1988 | Japan . |
| 1161851 | 6/1989 | Japan . |
| 2206148 | 8/1990 | Japan . |
| 2304927 | 12/1990 | Japan . |

OTHER PUBLICATIONS

Toru Kaga, et al.; "Advanced OSELO Isolation with Shallow Grooves for High–Speed Submicrometer ULSI's; IEEE Transactions on Electron Devices", vol. 35, No. 7, Jul. 1988; pp. 893–898.

*Primary Examiner*—George Fourson
*Attorney, Agent, or Firm*—Alan R. Loudermilk

[57] ABSTRACT

A process for formation of an isolating layer for a semiconductor device is disclosed. During formation of a field isolating layer, a pad oxide layer is formed which is intended to buffer the difference of the thermal expansion rates between the silicon substrate and a nitride layer. First and second side wall spacers are formed, so that the flow of the oxidant into the buffering pad oxide layer should be inhibited, and that the damage-causing shear stress should be reduced. Thus the structural defect having the shape of the bird's beak is prevented, thereby securing a high density element region. Further, during the formation of a monocrystalline silicon, the growth thickness may be optimized, so that the resulting semiconductor device should be flattened, thereby simplifying the process.

19 Claims, 5 Drawing Sheets

5,457,067

PROCESS FOR FORMATION OF AN ISOLATING LAYER FOR A SEMICONDUCTOR DEVICE

FIELD OF THE INVENTION

The present invention relates to processes for forming isolating layers for local isolation in semiconductor devices. More particularly, the present invention relates to processes for forming isolating layers for semiconductor devices, which are suitable for high density devices by eliminating formation of a bird's beak (sometimes referred to herein as "BB"), the bird's beak being disadvantageous for forming an active region with an oxidation for isolation of the device. Further, isolating layers formed in accordance with the present invention may be suitable for high density devices because the damage caused by stress and topology of the semiconductor device are minimized.

BACKGROUND OF THE INVENTION

Generally, conventional processes for forming an isolating layer based on the local oxidation method (known as "LOCOS") has been continuously improved with respect to various aspects, and such improvements have been proposed in various forms. There has been, however, no satisfactory structure that addresses the shear stress due to the topology and at the same time reducing the size of the bird's beak. Further, in order to solve these two problems, the process often becomes complicated, and, therefore, such modified processes often are not suitable to be put to practical use.

FIGS. 1A–1C are partial sectional views illustrating a process for forming an isolating layer for a semiconductor device based on the conventional LOCOS method. FIGS. 1D and 1E illustrate the distributions of the shear stress which gives the greatest influence to the topology and the damage formation, and are based on a simulation that was performed using a process simulator known as "TSUPREM" for a state of the topology after the field oxidation. In the graph contour, the solid lines illustrate the case where the value of the shear stress is $1 \times E9$ dyne/cm$^2$ and $5 \times E9$ dyne/cm$^2$ while each of the intervals is $1 \times E9$ dyne/cm$^2$.

First, FIGS. 1A–1C illustrate the process for formation of an element isolating layer based on a semi-recessed oxide LOCOS method. This process includes the steps of: forming pad oxide layer 2 on silicon substrate I for buffering the difference in the thermal expansions of silicon and the nitride layer, and then, forming nitride layer 3 thereupon as an inter-layer insulating film; removing the relevant portions of nitride layer 3 and pad oxide layer 2 to open a field oxide layer region, and then carrying out a thermal oxidation to form field oxide layer 21; and removing nitride layer 3.

FIG. 1D is a graphical illustration showing the topology of the thin layer structure of a semiconductor, which is based on a simulation performed using the process simulator known as "TSUPREM 4" on the isolating layer of the semiconductor device formed with what is known as the semi-recessed oxide LOCOS method. The dotted lines illustrate the sectional structures of the nitride layer, the buffer oxide layer and the silicon substrate, before formation of the field oxide layer. The solid lines illustrate a field oxide layer formed as a result of the expansion of the volume of the buffer oxide layer during the thermal oxidation process, and also illustrate the formation of a bird's beak as a result of the expansion of the boundary portion between the nitride layer and the field oxide layer.

FIG. 1E illustrates the distribution of the shear stress which provides a decisive influence with respect to defect formation as a result of the formation of a bird's beak on the element isolating structure of the semiconductor device, when the semi-recessed oxide LOCOS method is applied. That is, due to a difference of the thermal expansions between the nitride layer and the silicon, shear stress is formed, and this stress is concentrated in the BB portion.

FIGS. 1F–1I are partial sectional views illustrating a process for formation of an isolating layer for a semiconductor device based on the LOCOS method. FIGS. 1J and 1K illustrate the distribution of the shear stress which provides a decisive influence with respect to the defect formation and to the topography, again which is based on a simulation using the process simulator known as "TSUPREM 4" in a topological state after the field oxidation. In the graph contour, the solid lines illustrate the case where the value of the shear stress is $1 \times E9$ dyne/cm$^2$ and $5 \times$dyne/cm$^2$, while each of the intervals is $1 \times E9$ dyne/cm$^2$.

FIGS. 1F–1I illustrate a process for formation of an element isolating layer for a semiconductor device based on a FRO (fully recessed oxide) LOCOS method. The process includes the steps of: forming pad oxide layer 12 on silicon substrate 11, then forming nitride layer 13 thereupon as an inter-layer insulating film, and then removing the relevant portions of the nitride layer and the pad oxide layer to open the field oxide layer portion; then again removing the open portion of silicon substrate 11 to a certain depth by an anisotropic etching process; carrying out a thermal oxidation to form field oxide layer 12' on the open portion of silicon substrate 11; and, then, removing nitride layer 13.

FIG. 1J is a graphical illustration showing the topology of the thin structure of a semiconductor device, again which is based on a simulation performed on the element isolating layer of a semiconductor device using a process simulator known as "TSUPREM 4" and by applying the FRO LOCOS method. The dotted lines illustrate the sectional structures of the nitride layer, the buffer oxide layer and the silicon substrate, before the formation of the field oxide layer. The solid lines show a field oxide layer formed by the expansion of the volume of the buffer oxide layer during the thermal oxidation, and also show the formation of a bird's beak on the nitride layer and the silicon substrate as a result of the thermal expansion of the boundary portion between the nitride layer and the field oxide layer.

FIG. 1K illustrates the distribution of the shear stress which provides a decisive influence with respect to the defect formation in an element isolating layer of a semiconductor device which is formed by applying the FRO LOCOS method. That is, due to the difference of the thermal expansion rates between the nitride layer and the silicon, shear stress is generated, and this shear stress is concentrated in the BB portion.

In the above described conventional techniques for forming an isolating layer for a semiconductor device, the problems of the size of the bird's beak and the minimizing of the shear stress cannot be resolved simultaneously. Further, the process becomes complicated due to increased use of masking operations.

SUMMARY OF THE INVENTION

The present invention is intended to overcome the above described disadvantages of the conventional techniques.

Therefore, it is an object of the present invention to provide a process for formation of an isolating layer for a semiconductor device, in which, after etching the silicon substrate based on a conventional LOCOS method, there are formed a first side wall spacer for controlling the shear stress, and a second side wall spacer for controlling the bird's beak.

In a process for formation of an element isolating layer for a semiconductor device according to present invention, a pad oxide layer is formed which is intended to buffer the difference of the thermal expansion rates between a silicon substrate and a nitride layer. First and second side wall spacers are formed, so that the flow of the oxidant into the buffering pad oxide layer should be inhibited, and that the damage-causing shear stress should be reduced. Thus, the structural defect having the shape of a bird's beak is prevented, thereby securing a high density element region. Further, during formation of the monocrystalline silicon, the growth thickness is optimized, so that the device should be flattened, thereby simplifying the process.

A method in accordance with the present invention includes the steps for: (a) forming a pad oxide layer and a nitride layer on a silicon substrate; (b) etching the pad oxide layer and the nitride layer to open a portion where an isolating region is to be formed; (ac) removing by a certain thickness "tsi" the portion of the silicon substrate where the isolating region is to be formed; (d) forming a first side wall spacer on the partly removed silicon substrate and on the sides of the pad oxide layer; (e) forming a second side wall spacer on the sides of the first side wall spacer and on the sides of the nitride layer of the boundary of the isolating region; (f) growing mono-crystalline silicon on the surface of the exposed silicon substrate; and (g) carrying out a field oxidation to form a field oxide layer.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

FIG. 2 illustrates the process for formation of an element isolating layer for a semiconductor device according to the present invention.

Figure 1A:
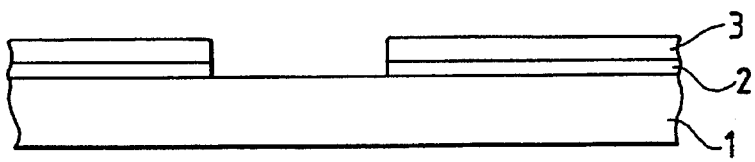
FIGS. 1A, 1B, 1C, 1D, 1E, 1F, 1G, 1H, 1I, 1J and 1K illustrate the topography and the distribution of the shear stress in a conventional element isolating layer for a semiconductor device.
Figure 1B:
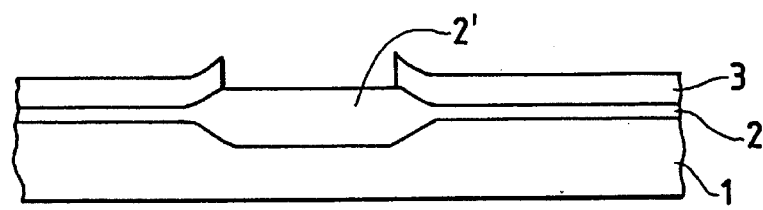
Figure 1C:
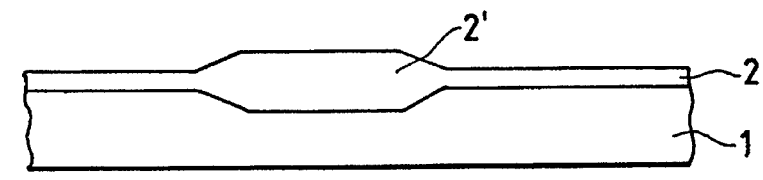
Figure 1D:
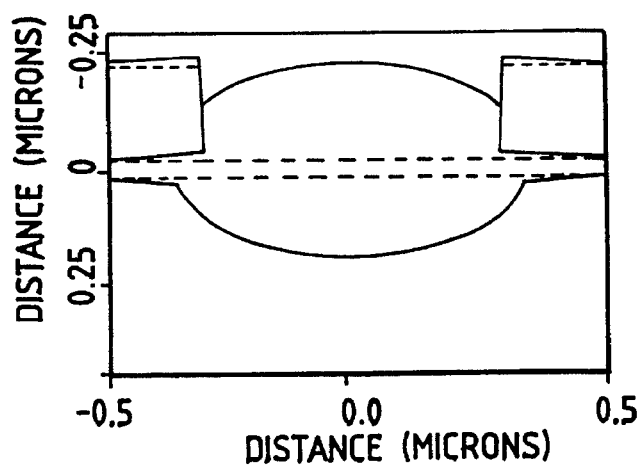
Figure 1E:
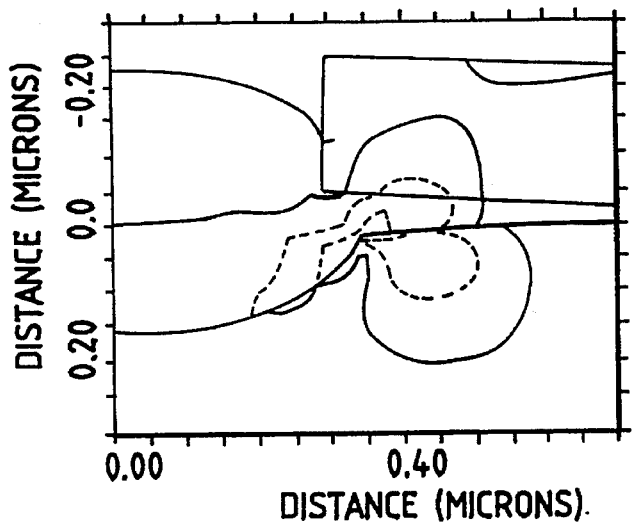
Figure 1F:
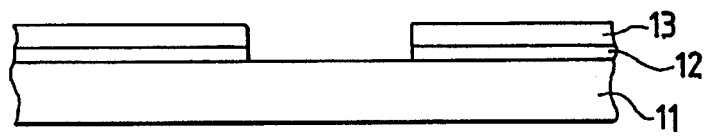
Figure 1G:
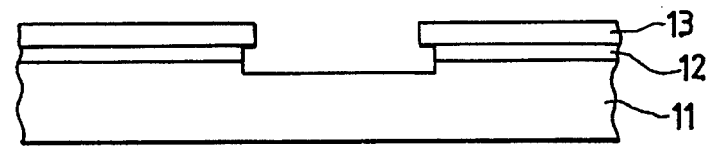
Figure 1H:
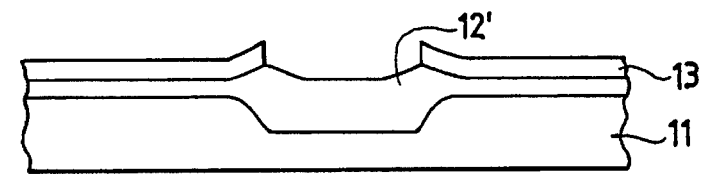
Figure 1I:
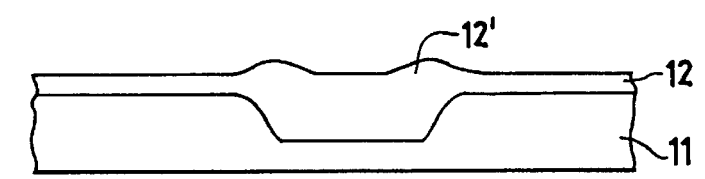
Figure 1J:
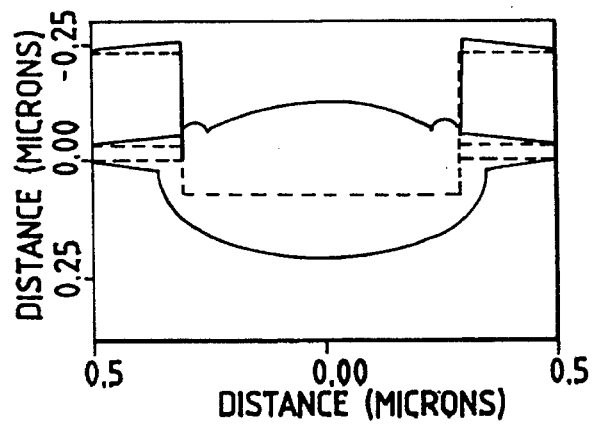
Figure 1K:
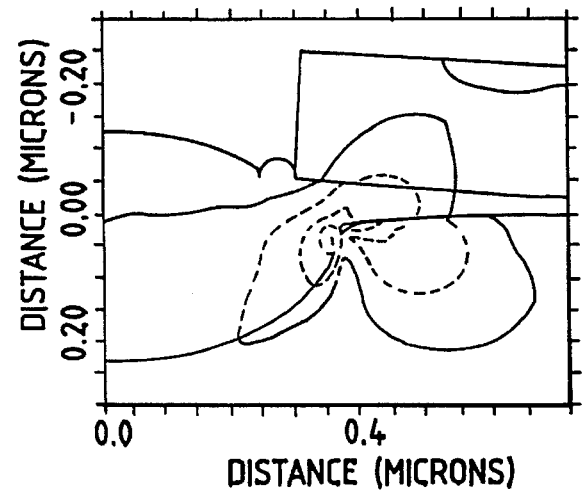
Figure 2A:
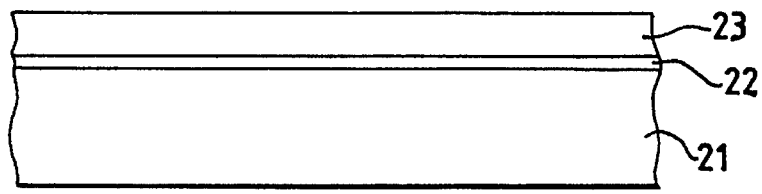
FIGS. 2A, 2B, 2C, 2D, 2E and 2F illustrate a process for formation of an isolating layer for a semiconductor device according to the present invention.

As illustrated in FIG. 2A, pad oxide layer 22 is deposited upon silicon substrate 21, and nitride layer 23 is deposited thereupon. Later, when a heat treatment is carried out for forming a field oxide layer, pad oxide layer 22 serves a buffering role for reducing the shear stress which is caused by the difference in the thermal expansion coefficients between nitride layer 23 and the silicon of substrate 21. Meanwhile, nitride layer 23 prevents oxidation of the active region during the field oxidation step.

Figure 2B:
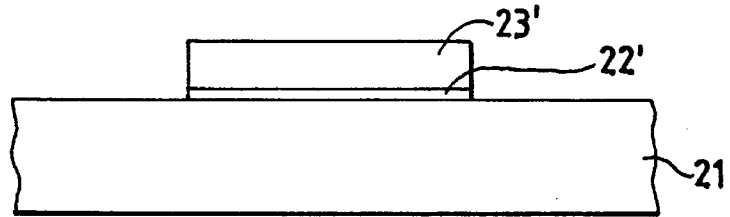

As illustrated in FIG. 2B, a photo resist is spread on nitride layer 23, and, then, a photo resist pattern (not shown) is defined through exposing and developing by using an isolating region-forming mask. Thereafter, nitride layer 23 and buffering pad oxide layer 22 are anisotropically etched.

Figure 2C:
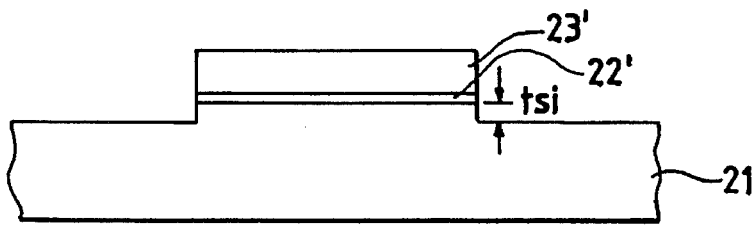

As illustrated in FIG. 2C, an anisotropic etching is carried out using nitride layer 23' as a mask to remove the silicon of substrate 21 to as much as a certain depth (tsi). Under this condition, if the silicon etching depth (tsi) is too great, a hole will be formed during removal of the nitride of the second side wall spacer after the oxidation, and, therefore, the etching depth should be desirably at or about a quarter of the expected field oxide layer.

Figure 2D:
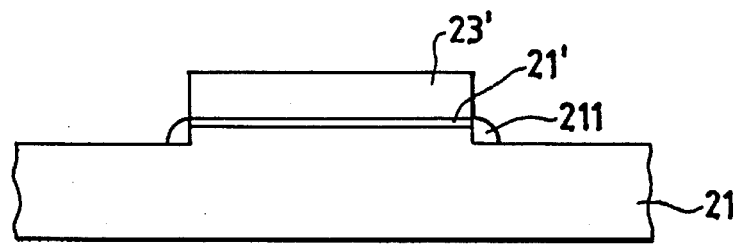

As illustrated in FIG. 2D, polysilicon or an oxide is deposited on the whole surface of the structure, and an anisotropic etching is carried out using silicon substrate 21 as an etch stop layer, thereby defining first side wall spacer 211. The deposition thickness of the polysilicon or the oxide layer is designed to be smaller than the sum of the etched depth tsi of silicon substrate 21 plus the thickness of pad oxide layer 22 plus the thickness of nitride layer 23'. First side wall spacer 211 thus formed will serve to prevent the generation of shear stress which can be generated due to the difference of the thermal expansion coefficients between silicon substrate 21 and nitride layer 23'. That is, first side wall spacer 211 is made of polysilicon or silicon oxide, so that the viscous flow of the oxidant becomes smoother during the field oxidation, thereby making it possible to control the shear stress between the materials.

Figure 2E:
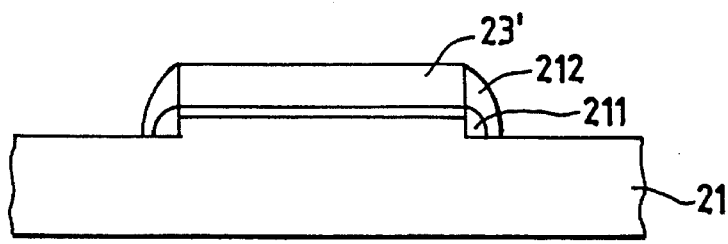

As illustrated in FIG. 2E, a nitride layer is deposited on the whole surface, and an anisotropic etching is carried out using silicon substrate 21 as an etch stop layer, thereby forming second side wall spacer 212 on the sides of nitride layer pattern 23' and on the surface of first side wall spacer 211. Second side wall spacer 212 thus formed will serve to prevent the formation of a BB which can appear during the field oxidation.

Figure 2F:
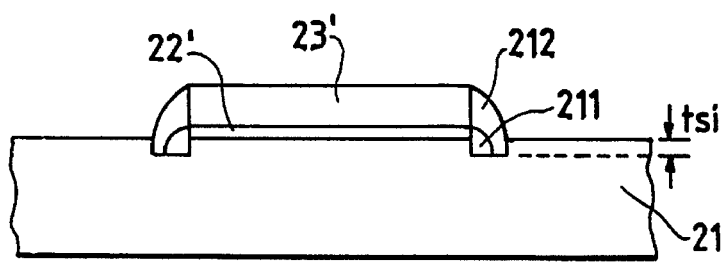

As illustrated in FIG. 2F, monocrystalline silicon is grown to as much as tsi on the surface of exposed silicon substrate 21.

Thereafter, a field oxidation process is carried out to form a field oxide layer which distinguishes an active region and an isolating region. Under this condition, when second side wall spacer 212 is oxidized from the first etched face down to the silicon change depth after growth of the monocrystalline silicon, second side wall spacer 212 which is formed at the step of FIG. 2E prevents the flow of the oxidant into the active region (which is under the nitride layer), thereby preventing the formation of the bird's beak.

Figure 3A:
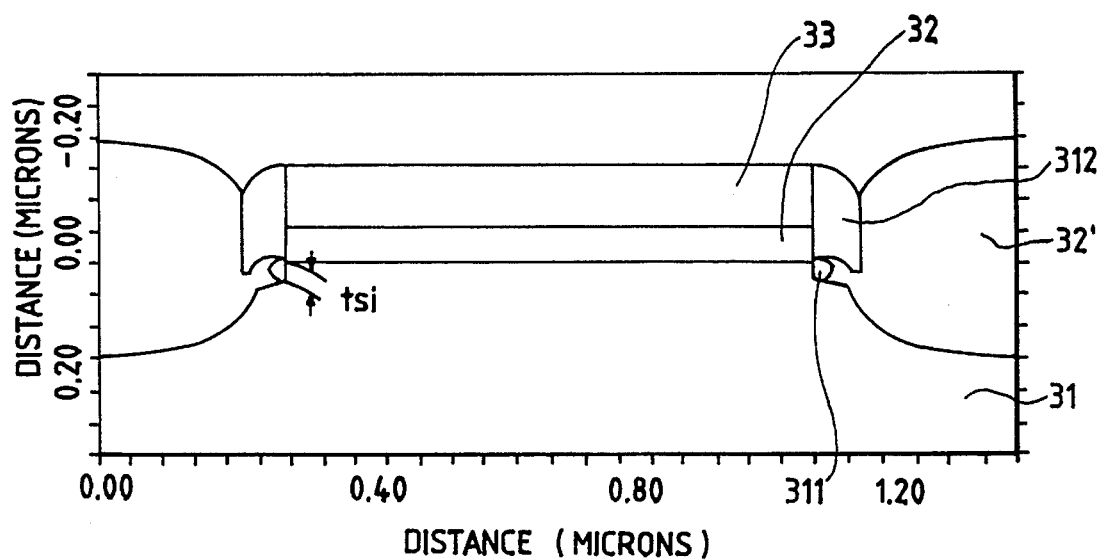
FIGS. 3A and 3B illustrate the distribution of the shear stress and the topography which are seen with a dual-side wall structure process according to the present invention.
Figure 3B:
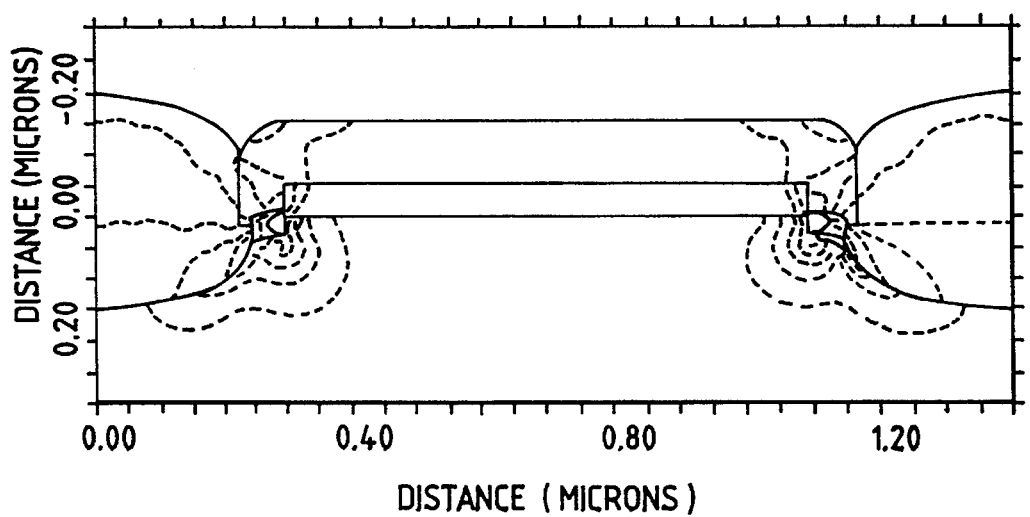
Figure 4A:
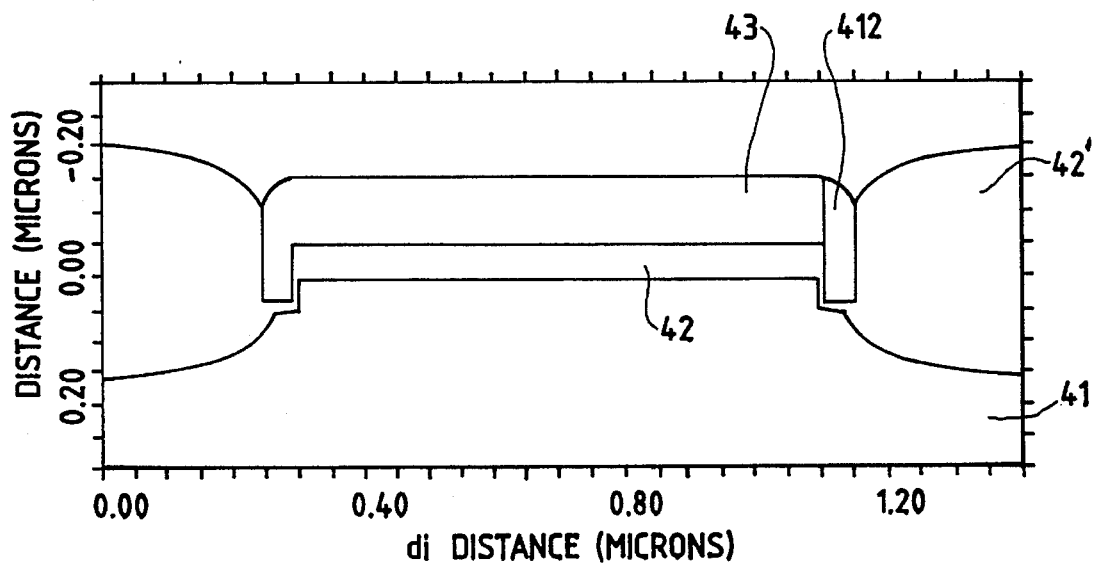
FIGS. 4A and 4B illustrate the distribution of the shear stress and the topography which are seen in the case of the provision of a single side wall for comparison with the isolating layer of the semiconductor device according to the present invention.
Figure 4B:
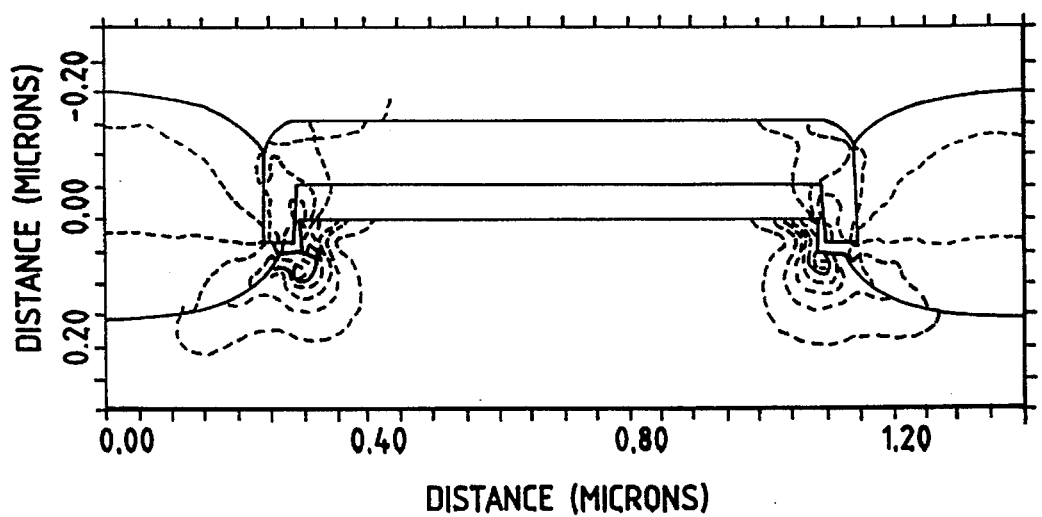

FIGS. 3A and 3B illustrate the distribution of the shear stress and the topography after carrying out the field oxidation based on the formation process according to the present invention, which are based on a simulation using TSUPREM 4. FIGS. 4A and 4B illustrate shear stress comparison results for the case where the first side wall spacer is not formed; that is, where a single side wall spacer is provided. The two cases utilize the same heat cycle.

FIG. 3A is a graphical illustration illustrating the element isolating layer for a semiconductor device, i.e., the topology of the thin layer structure of a semiconductor device, which is based on a simulation using the process simulator "TSU- PREM 4." The drawing illustrates nitride layer 33, buffer pad oxide layer 32, first side wall spacer 311, second side wall spacer 312, field oxide layer 32' and silicon substrate 31 after carrying out the field oxidation; particularly, it is seen that a bird's beak is not formed.

Further, the volume of the pad oxide layer will be expanded during the thermal oxidation to form a field oxide layer. For this reason, a BB (bird's beak) defect might be formed on the outer portion of the boundary between the nitride layer and the silicon due to the expansion of the boundary portion between the nitride layer and the field oxide layer. When the silicon is oxidized down to the silicon change depth after the growth of the monocrystalline silicon on the first etched silicon face, however, second side wall spacer 312 prevents the flow of the oxidant into the active region, thereby preventing the formation of a bird's beak. First side wall spacer 311 disperses the shear stress to inhibit BB formation.

FIG. 3B illustrates the distribution of the shear stress which provides a decisive influence with respect to the formation of a defect in an isolating layer for a semiconductor device according to the present invention. The shear stress is generated due to the difference of thermal expansion between the nitride layer and the silicon in the conventional techniques, and the distribution of the shear stress is concentrated in the BB portion. According to the present invention, however, first side wall spacer 311 is formed of polysilicon or silicon oxide, so that spacer 311 should be able to control the shear stresses between the materials by making the viscous flow of the oxidant smooth. Thus as illustrated by the dotted lines in the drawing, the shear stress is not concentrated on the conventional BB, but is spread uniformly.

FIGS. 4A and 4B illustrate the distribution of the shear stress and the topography for the case where only second side wall spacer 412 is formed in the element isolating layer for a semiconductor device for purposes of comparison.

First, FIG. 4A illustrates the thin layer structure topology for an isolating layer for a semiconductor device for the case where only the second side wall spacer is provided, which is based on a simulation is performed using the process simulator "TSUPREM 4." The drawing illustrates nitride layer 43, buffer pad oxide layer 42, second side wall spacer 412, field oxide layer 42', silicon substrate 41 after the field oxidation; particularly, it is seen that, unlike that of FIG. 3A, second side wall spacer 412 is slightly twisted. This can be explained as follows. When second side wall spacer 412 is oxidized down to the silicon change depth after the growth of the monocrystalline silicon on the first etched silicon face, spacer 412 prevents the flow of the oxidant into the active region which is under the nitride layer. There is no first side wall spacer, however, as in the present invention as described above, and, therefore, the shear stress cannot be controlled.

FIG. 4B illustrates the distribution of the shear stress which affects the formation of the BB defect, for the case where only the second side wall spacer is provided in the isolating layer for a semiconductor device. Unlike the present invention as described above, this structure has no first side wall spacer, and shear stress is generated due to the difference of the thermal expansions between the nitride layer and the silicon. This shear stress is concentrated in the BB portion, resulting in the formation of a slight bird's beak. That is, it is seen that the shear stress is concentrated in the BB portion as in the conventional techniques.

According to the present invention as described above, during the formation of the field isolating layer, a pad oxide layer is formed between the silicon substrate and the nitride layer to absorb the difference in the thermal expansion between the nitride layer and the silicon, and first and second side wall spacers are formed, so that the flow of the oxidant into the buffering pad oxide layer should be inhibited, and that the damage-causing shear stress should be reduced. Thus BB formation is prevented, and a high density active region is secured. Further, during the growth of the monocrystalline silicon, the growth thickness is adjusted and optimized, so that the device should be flattened, and the process should be simplified. In other words, the thickness of the monocrystalline silicon may be controlled, with result that the topological flatness of the semiconductor device may be improved.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for forming an isolating layer for a semiconductor device, comprising the steps of:

(a) forming a pad oxide layer and a nitride layer on a silicon substrate;

(b) removing the pad oxide layer and the nitride layer at an isolating layer region, the pad oxide layer and the nitride layer each having a edge portion at the boundary of the isolating layer region;

(c) removing a portion of the silicon substrate to a first thickness in the isolating layer region;

(d) forming a first side wall spacer on the edge portion of the pad oxide layer, the first side wall spacer extending to the silicon substrate at the boundary of the isolating layer region;

(e) forming a second side wall spacer on the first side wall spacer and on the edge portion of the nitride layer, the second side wall spacer extending to the silicon substrate;

(f) forming monocrystalline silicon on the silicon substrate in the isolating layer region; and (g) oxidizing the isolating layer region, wherein the field oxide isolating layer is formed.

2. The process of claim 1, wherein the field oxide isolating layer is of a second thickness, and wherein the first thickness is about one fourth of the second thickness.

3. The process of claim 1, wherein the first side wall spacer comprises polysilicon.

4. The process of claim 3, wherein the thickness of the first side wall spacer is less than the sum of the first thickness plus the thickness of the pad oxide layer plus the thickness of the nitride layer.

5. The process of claim 1, wherein the first side wall spacer comprises silicon oxide.

6. The process of claim 5, wherein the thickness of the first side wall spacer is less than the sum of the first thickness plus the thickness of the pad oxide layer plus the thickness of the nitride layer.

7. The process of claim 1, wherein the thickness of the monocrystalline silicon is controlled such that the surface of the field oxide is substantially planar with the surface of the substrate.

8. A process for forming an isolating layer for a semiconductor device, comprising the steps of:

(a) forming a pad insulating layer and a first oxidant-flow inhibiting layer on a substrate;

(b) removing the pad insulating layer and the first oxidant-flow inhibiting layer at an isolating layer region, the pad insulating layer and the first oxidant-flow inhibiting layer each having a edge portion at the boundary of the isolating layer region;

(c) removing a portion of the substrate to a first thickness in the isolating layer region;

(d) forming a first side wall spacer on the edge portion of the pad insulating layer, the first side wall spacer extending to the substrate at the boundary of the isolating layer region;

(e) forming a second side wall spacer comprising a second oxidant-flow inhibiting layer on the first side wall spacer and on the edge portion of the first oxidant-flow inhibiting layer, the second side wall spacer extending to the substrate;

(f) forming a monocrystalline layer on the substrate in the isolating layer region; and (g) oxidizing the isolating layer region to form the isolating layer on the substrate.

9. The process of claim 8, wherein the isolating layer is of a second thickness, and wherein the first thickness is about one fourth of the second thickness.

10. The process of claim 8, wherein the first side wall spacer comprises polysilicon.

11. The process of claim 10, wherein the thickness of the first side wall spacer is less than the sum of the first thickness plus the thickness of the pad insulating layer plus the thickness of the first oxidant-flow inhibiting layer.

12. The process of claim 8, wherein the first side wall spacer comprises silicon oxide.

13. The process of claim 12, wherein the thickness of the first side wall spacer is less than the sum of the first thickness plus the thickness of the pad insulating layer plus the thickness of the first oxidant-flow inhibiting layer.

14. The process of claim 8, wherein the thickness of the monocrystalline layer is controlled such that the surface of the field oxide is substantially planar with the surface of the substrate.

15. The process of claim 8, wherein the first oxidant-flow inhibiting layer and the second side wall spacer comprise nitride, wherein oxidant flow into the pad insulating layer is inhibited.

16. The process of claim 8, wherein the pad insulating layer comprises oxide.

17. The process of claim 8, wherein the pad insulating layer comprises oxide, the substrate comprises silicon, the first oxidant-flow inhibiting layer comprises nitride, and the monocrystalline layer comprises silicon.

18. The process of claim 17, wherein the thickness of the first side wall spacer is less than the sum of the first thickness plus the thickness of the pad insulating layer plus the thickness of the first oxidant-flow inhibiting layer.

19. The process of claim 18, wherein the thickness of the monocrystalline silicon layer is controlled such that the surface of the field oxide is substantially planar with the surface of the substrate.

* * * * *